United States Patent
Wang et al.

(10) Patent No.: US 9,123,783 B2
(45) Date of Patent: Sep. 1, 2015

(54) INTEGRATED CIRCUITS AND METHODS OF FORMING INTEGRATED CIRCUITS WITH INTERLAYER DIELECTRIC PROTECTION

(71) Applicant: GLOBALFOUNDRIES Inc., Grand Cayman (KY)

(72) Inventors: Xin Wang, Malta, NY (US); Changyong Xiao, Mechanicville, NY (US); Yue Hu, Malta, NY (US); Yong Meng Lee, Mechanicville, NY (US); Meng Luo, Malta, NY (US); Jialin Weng, Clifton Park, NY (US); Wei Hua Tong, Mechanicville, NY (US); Wen-Pin Peng, Clifton Park, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 96 days.

(21) Appl. No.: 13/673,549

(22) Filed: Nov. 9, 2012

(65) Prior Publication Data
US 2014/0131881 A1    May 15, 2014

(51) Int. Cl.
*H01L 21/44* (2006.01)
*H01L 21/768* (2006.01)
*H01L 21/285* (2006.01)

(52) U.S. Cl.
CPC .... *H01L 21/76846* (2013.01); *H01L 21/28518* (2013.01); *H01L 21/76831* (2013.01); *H01L 21/76844* (2013.01); *H01L 21/76814* (2013.01)

(58) Field of Classification Search
CPC ........ H01L 21/20; H01L 23/48; H01L 21/768
USPC ............................................ 438/664; 257/774
See application file for complete search history.

(56) References Cited

U.S. PATENT DOCUMENTS

| | | | |
|---|---|---|---|
| 7,030,441 B2 * | 4/2006 | Wu et al. ........................ | 257/296 |
| 2003/0232481 A1 * | 12/2003 | Huang et al. ................... | 438/396 |
| 2009/0218699 A1 | 9/2009 | Torres et al. | |
| 2010/0123198 A1 * | 5/2010 | Kim et al. ...................... | 257/377 |

* cited by examiner

*Primary Examiner* — Theresa T Doan
(74) *Attorney, Agent, or Firm* — Ingrassia Fisher & Lorenz, P.C.

(57) ABSTRACT

Integrated circuits and methods of forming integrated circuits are provided herein. In an embodiment, a method of forming an integrated circuit includes providing a base substrate having an embedded electrical contact disposed therein. An interlayer dielectric is formed overlying the base substrate, and a recess is etched through the interlayer dielectric over the embedded electrical contact. A protecting liner is formed in the recess and over an exposed surface of the embedded electrical contact in the recess. The protecting liner includes at least two liner layers that have materially different etch rates in different etchants. A portion of the protecting liner is removed over the surface of the embedded electrical contact to again expose the surface of the embedded electrical contact in the recess. An embedded electrical interconnect is formed in the recess. The embedded electrical interconnect overlies the protecting liner on sides of the recess.

16 Claims, 4 Drawing Sheets

INTEGRATED CIRCUITS AND METHODS OF FORMING INTEGRATED CIRCUITS WITH INTERLAYER DIELECTRIC PROTECTION

TECHNICAL FIELD

The technical field generally relates to integrated circuits and methods of forming integrated circuits having an embedded electrical interconnect within an interlayer dielectric of the integrated circuit. More particularly, the present invention relates to integrated circuits and methods of forming integrated circuits where the interlayer dielectric is protected from degradation after formation of a recess therein in anticipation of forming an embedded electrical interconnect in the recess.

BACKGROUND

Embedded electrical interconnects within dielectric substrates find widespread use for various electronic applications. For example, microprocessor integrated circuits generally include numerous levels of interconnect routing in the form of electrical interconnects, such as lines and dots, embedded within a dielectric substrate to connect transistors within the integrated circuits. Each level of interconnect routing is separated from immediately adjacent levels by the dielectric material, referred to in the art as an interlayer dielectric (ILD). The ILD generally includes an oxide layer that includes an oxide, such as silicon dioxide formed from tetraethyl orthosilicate (TEOS), and may include one or more additional layers of dielectric material such as low-k or ultralow k (ULK) material. Adjacent levels of interconnect routing may be embedded in distinct layers of ILD, and with the interconnect routing configured in such a way so as to ensure that dielectric material separates the adjacent interconnect routings. In this regard, the embedded electrical interconnects in the interconnect routing can be selectively insulated from both other embedded electrical interconnects in the same interconnect routing and from embedded electrical interconnects in interconnect routing of adjacent levels. Likewise, embedded electrical interconnects in adjacent levels of interconnect routing can also be selectively connected to fabricate desired circuitry in the integrated circuits.

To form levels of interconnect routing, the ILD is generally formed followed by selective etching of recesses, such as trenches or vias, in the ILD. Metal interconnects are then formed through blanket deposition of metal over the ILD and in the recesses, followed by chemical-mechanical planarization (CMP). Under some circumstances, additional processing is conducted after recess formation and prior to formation of the metal interconnects, and the additional processing may degrade the ILD and cause damage to the integrated circuit. For example, in some circumstances, an ILD is formed directly over embedded electrical contacts in a base substrate, followed by recess formation to expose the embedded electrical contacts. "Base substrate", as referred to herein, includes any underlying substrate (including a semiconductor substrate or a dielectric substrate) that have an embedded electrical contact therein (such as a source/drain region for a transistor or an electrical interconnect). Metal interconnects are subsequently formed in the recesses and are electrically connected to the embedded electrical contacts through the ILD. The embedded electrical contacts include silicon-containing material, which may have an undesirably high contact resistance. To lower contact resistance between the embedded electrical contacts and the subsequently-formed metal interconnects, a metal silicide layer may be formed in the embedded electrical contact by blanket depositing a thin layer of silicide-forming metal on the ILD and the embedded electrical contact in the recess followed by annealing to form the metal silicide layer. Unreacted silicide-forming metal is then removed such as by wet etching in a $H_2O_2/H_2SO_4$ or $HNO_3/HCL$ solution. The ILD is vulnerable to damage at various points during silicide formation. Furthermore, the ILD that is formed directly over the embedded electrical contacts may have interfaces between various layers in the ILD, and damage to the interfaces in the recesses can result in flow of metal ions from the metal interconnect or other harsh compounds through the interfaces to other sensitive features within the integrated circuit. Further still, time dependent dielectric breakdown (TDDB), which results from migration of metal ions from the embedded electrical interconnects into an interface between adjacent levels of ILD, is a concern for layers of ILD that are spaced from the embedded electrical contacts. While it is generally known to form an electrically-conductive barrier layer in recesses prior to forming metal interconnects, the electrically-conductive barrier layers are formed just prior to metal interconnect formation and effectively seal the metal interconnect from the remaining exposed portions of the ILD. Therefore, formation of the electrically-conductive barrier layer is often too late to protect the ILD from the additional processing, which may degrade the ILD and cause damage to the integrated circuit.

Accordingly, it is desirable to provide methods of forming integrated circuits having an embedded electrical interconnect within an interlayer dielectric with the interlayer dielectric protected from damage that may occur after recess formation but prior to formation of the embedded electrical interconnect and any other electrically-conductive features in the recess. In addition, it is desirable to provide integrated circuits having a substrate with an embedded electrical interconnect disposed therein, with a protecting liner disposed between the interlayer dielectric and the embedded electrical interconnect, while still enabling electrical connection to be established between the embedded electrical contact in the base substrate and the embedded electrical interconnect in the ILD. Furthermore, other desirable features and characteristics of the present invention will become apparent from the subsequent detailed description of the invention and the appended claims, taken in conjunction with the accompanying drawings and this background of the invention.

BRIEF SUMMARY

Integrated circuits and methods of forming integrated circuits are provided herein. In an embodiment, a method of forming an integrated circuit includes providing a base substrate having an embedded electrical contact disposed therein. An interlayer dielectric is formed overlying the base substrate. A recess is etched through the interlayer dielectric over the embedded electrical contact, with a surface of the embedded electrical contact exposed in the recess. A protecting liner is formed in the recess and over the exposed surface of the embedded electrical contact in the recess. The protecting liner includes at least two liner layers that have materially different etch rates in different etchants. A portion of the protecting liner is removed over the surface of the embedded electrical contact to again expose the surface of the embedded electrical contact in the recess. An embedded electrical interconnect is formed in the recess. The embedded electrical interconnect overlies the protecting liner on sides of the recess.

In another embodiment of a method of forming an integrated circuit a semiconductor wafer is provided. A transistor is formed on the semiconductor wafer to form a semiconductor substrate. The transistor includes a gate electrode and embedded electrical contacts that are disposed in the semiconductor wafer on opposite sides of the gate electrode. The embedded electrical contacts include silicon-containing material. An interlayer dielectric is formed overlying the semiconductor substrate. A recess is etched through the interlayer dielectric over the embedded electrical contacts, with surfaces of the embedded electrical contacts exposed in the recess. A protecting liner is formed in the recess and over the exposed surfaces of the embedded electrical contacts in the recess. The protecting liner includes an underlying liner layer that includes a first dielectric material, and the protecting liner also includes an outermost liner layer that includes a second material that is chosen from a second dielectric material different from the first dielectric material or a metal-containing material. A portion of the protecting liner is removed over the surfaces of the embedded electrical contacts to again expose the surfaces of the embedded electrical contacts in the recess. A salicide layer is formed in the embedded electrical contacts after removing the portion of the protecting liner over the surfaces of the embedded electrical contacts. An electrically-conductive barrier material is deposited in the recess to form a barrier layer over the protecting liner. An embedded electrical interconnect is formed over the barrier layer in the recess. The embedded electrical interconnect overlies the protecting liner on sides of the recess and the salicide layer on a bottom of the recess.

In another embodiment, an integrated circuit includes a base substrate that has an embedded electrical contact disposed therein. An interlayer dielectric is disposed over the base substrate. The interlayer dielectric has an embedded electrical interconnect disposed therein. The embedded electrical interconnect is in electrical communication with the embedded electrical contact. A protecting liner is disposed between the embedded electrical interconnect and the interlayer dielectric. The protecting liner includes at least two liner layers that have materially different etch rates in different etchants.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any theory presented in the preceding background or the following detailed description.

Integrated circuits and methods of forming integrated circuits are provided herein. The methods involve formation of an interlayer dielectric over a base substrate that has an embedded electrical contact disposed in the base substrate. A recess is etched through the interlayer dielectric over the embedded electrical contact to expose a surface of the embedded electrical contact in the recess, followed by eventually forming an embedded electrical interconnect in the recess. The methods described herein enable the interlayer dielectric to be protected from damage that may occur after recess formation but prior to formation of the embedded electrical interconnect and any other electrically-conductive features in the recess. To protect the embedded electrical interconnect, a protecting liner is formed in the recess and over an exposed surface, with the protecting liner having at least two liner layers that have materially different etch rates in different etchants. By "materially different", it is meant that an etchant and etching technique that is effective to etch one of the layers etches another of the layers at rate that is measurably slower, such as at least 50 percent slower. By providing the protecting liner with the at least two liner layers that have materially different etch rates in different etchants, preferential etching of the protecting liner at a bottom of the recess is possible to enable the embedded electrical contact to again be exposed. Materials for the at least two liner layers can be selected to ensure that a layer of the protecting liner that is in contact with the embedded electrical contact is etchable with an etchant that has an immaterial etching effect on the embedded electrical contact, while also maintaining desired tolerances of the protecting liner on sides of the recess. In this manner, sides of recess can be protected while still enabling electrical connection to be established between the embedded electrical contact in the base substrate and the embedded electrical interconnect in the interlayer dielectric. With the protecting liner in place on sides of the recess, optional salicide formation in the embedded electrical contact and other additional optional techniques may be conducted in the recess with the surface of the embedded electrical contact exposed after recess formation and prior to formation of the embedded electrical interconnect, and also prior to formation of any barrier layers that include electrically-conductive barrier material in the recess that prevent access to the embedded electrical contact in the base substrate, without damaging the interlayer dielectric at the sides of the recess.

Figure 1:
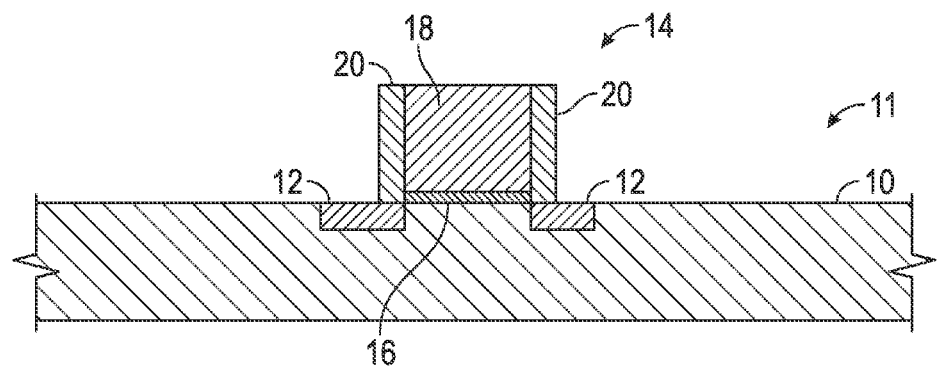
FIG. 1 is a schematic cross-sectional side view of a portion of an integrated circuit including a semiconductor wafer and a transistor formed on the semiconductor wafer, with embedded electrical contacts of the transistor disposed in the semiconductor wafer.

An embodiment of a method of forming an integrated circuit will now be described with reference to FIGS. 1-7. Referring to FIG. 1, the method includes providing a base substrate 11 having an embedded electrical contact 12 disposed in the base substrate 11. As shown in FIG. 1, the base substrate 11 may have a plurality of embedded electrical contacts 12 disposed therein, and may include millions of embedded electrical contacts 12 disposed therein. In this regard, the embedded electrical contacts 12 may be formed with nanometer-scale dimensions, e.g., with dimensions less than $1 \times 10^{-6}$ mm. As shown in FIG. 1, the base substrate 11 may be a semiconductor substrate 11 that has the embedded electrical contact 12 disposed therein and the embedded electrical contact 12 may be part of a device 14, such as a transistor 14, capacitor, resistor, or the like. In this embodiment, the semiconductor substrate 11 may include silicon-containing material, such as mono- or poly-crystalline silicon, and may contain one or more doped regions of silicon-containing material. However, it is to be appreciated that the base substrate 11 can include any semiconductor material.

In an exemplary embodiment and as also shown in FIG. 1, the method includes forming the transistor 14 on a semiconductor wafer 10 to form the semiconductor substrate 11. To form the transistor 14, a gate dielectric layer 16 is formed overlying the semiconductor wafer 10. The gate dielectric layer 16 may include an insulator material such as, but not limited to, silicon dioxide, silicon oxide, silicon nitride, or the like, and may be formed by thermal growing or other deposition techniques. The gate dielectric layer 16 may have a thickness of from about 1 nm to about 10 nm, although the actual thickness can vary based on the application. A gate electrode 18 is then formed overlying the gate dielectric layer 16, and may be formed from conventional materials including doped or undoped polycrystalline silicon. Conventional masking and post-deposition etching techniques may then be employed to appropriately shape the gate dielectric layer 16 and gate electrode 18, thereby providing the configuration shown in FIG. 1 for the gate dielectric layer 16 and the gate electrode 18. After forming the gate dielectric layer 16 and gate electrode 18, the embedded electrical contacts 12 are formed as a source region and drain region for the transistor 14. Sidewall spacers 20 are then formed on opposite sides of the gate electrode 18 to insulate the gate electrode 18.

Figure 2:
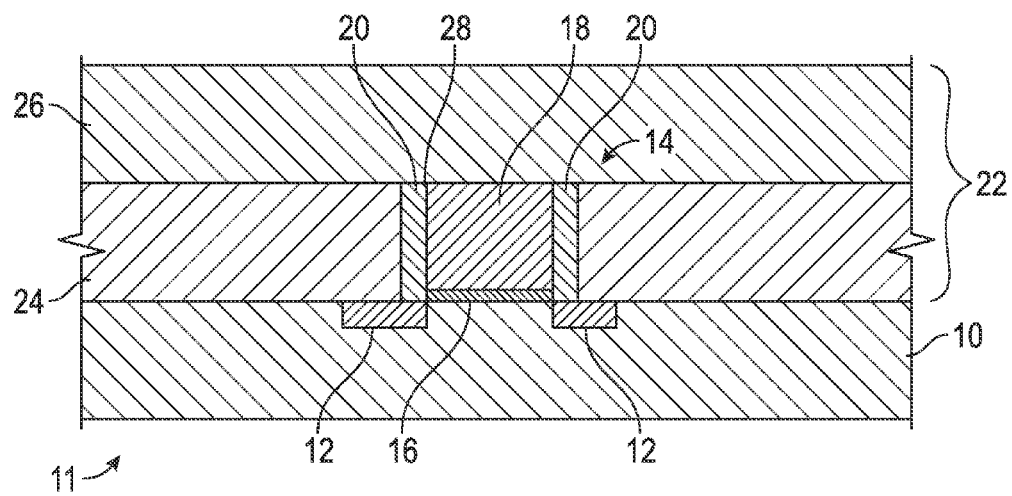
FIG. 2 is a schematic cross-sectional side view of the portion of the integrated circuit shown in FIG. 1 with an interlayer dielectric overlying the semiconductor wafer.

Referring to FIG. 2, an interlayer dielectric 22 is then formed overlying the base substrate 11. In an embodiment, the interlayer dielectric 22 includes at least one dielectric layer 24, 26 including a dielectric material that is formed overlying the sidewall spacers 20 and the gate electrode 18. For example, a first dielectric layer 24 is formed including an interlayer dielectric material. The interlayer dielectric material is not particularly limited, but can be a low-k or ultra-low k material such as an oxide. One specific example of a suitable oxide is silicon oxide. Alternatively, the interlayer dielectric material is a silicon nitride or a silicon carbide. Such low k or ultra-low k dielectric materials are known in the art and are particularly useful in dielectric layers of integrated circuits. The first dielectric layer 24 may be formed over the base substrate 11 through conventional techniques.

In an embodiment and as shown in FIG. 2, the first dielectric layer 24 is disposed directly upon a surface of the base substrate 11. In another embodiment, although not shown, at least one additional underlying dielectric layer is formed between the first dielectric layer 24 and the underlying substrate. As also shown in FIG. 2, the interlayer dielectric 22 may include a second dielectric layer 26, and the second dielectric layer 26 may be formed over the first dielectric layer 24. The second dielectric layer 26 may be formed from another interlayer dielectric material that is the same as or different than the interlayer dielectric material described above. An interface 28 is defined between the gate electrode 18 and the at least one dielectric layer 24, 26 of the interlayer dielectric 22, where surfaces of the gate electrode 18 and one of the dielectric layers 24, 26 meet. For example, as shown in FIG. 2, a top surface of the first dielectric layer 24 is on even plan with a top surface of the gate electrode 18 and top surfaces of the sidewall spacers 20, and the second dielectric layer 26 overlies the first dielectric layer 24, the sidewall spacers 20, and the gate electrode 18, with the interface 28 defined between the second dielectric layer 26 and the gate electrode 18 (as well as between the second dielectric layer 26 and the sidewall spacers 20). The interface 28 is undesirable due to a potential for flow of metal ions or other harsh compounds through the interface 28 to other sensitive features within the integrated circuit, such as the gate electrode 18. Therefore, as described in further detail below, measures are taken to impede the flow of metal ions or other harsh compounds through the interface 28. Although not shown in FIG. 2, additional overlying dielectric layers, such as a TEOS layer, may be formed over the second dielectric layer 26. Configurations of dielectric layers as described above are well known in the art of integrated circuit design.

Figure 3:
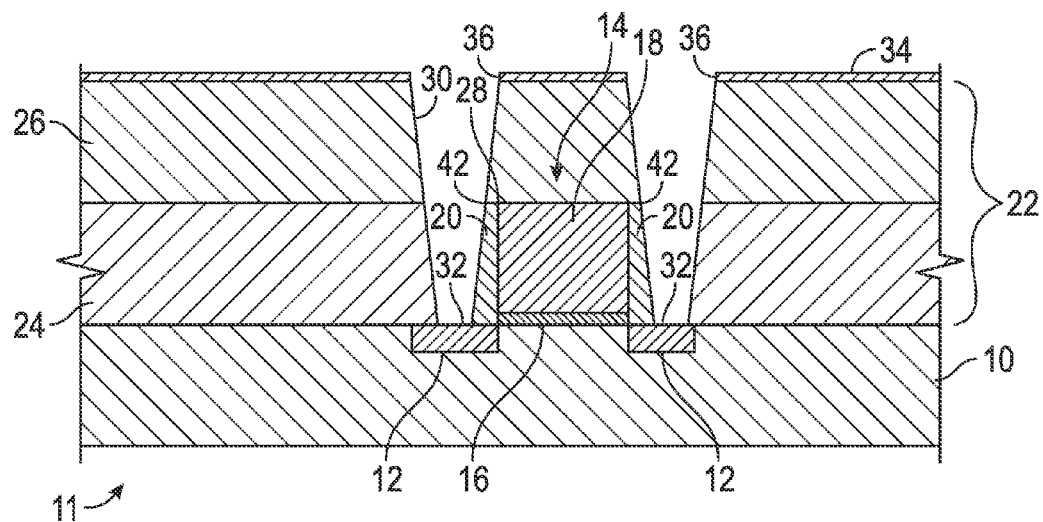
FIG. 3 is a schematic cross-sectional side view of the portion of the integrated circuit of FIG. 2 showing a recess etched through the interlayer dielectric with a surface of the embedded electrical contact exposed in the recess.

Referring to FIG. 3, a recess 30 is etched through the interlayer dielectric 22 over the embedded electrical contact 12, with a surface 32 of the embedded electrical contact 12 exposed in the recess 30. Recesses 30 may be etched for each embedded electrical contact 12 for purposes of enabling electrical connection to the embedded electrical contacts 12 as described in further detail below. In an exemplary embodiment, to etch the recess 30, an etch mask 34 is patterned over the interlayer dielectric 22. The etch mask 34 may be formed through conventional lithography techniques, such as by negative or positive photolithography. For purposes of the specific method shown in FIG. 3, the etch mask 34 has at least two patterned gaps 36 therein for enabling the underlying interlayer dielectric 22 to be etched in the patterned gaps 36, although it is to be appreciated that the etch mask 34 may have millions of patterned gaps 36 therein. Like the embedded electrical contacts 12 in the base substrate 11, the patterned gaps 36 may be formed with nanometer-scale dimensions. In an embodiment, as shown in FIG. 3, the at least two patterned gaps 36 are located over the at least two embedded electrical contacts 12 that are disposed in the base substrate 11. However, for purposes of the methods described herein, the patterned gaps 36 in the etch mask 34 may be configured in any pattern based upon a configuration of vias or trenches that are to be etched in the interlayer dielectric 22 through the patterned gaps 36.

In an embodiment, the recess 30 is etched through the interlayer dielectric 22 with dimensions that are larger than actually necessary to establish electrical connection to the embedded electrical contact 12. In particular, the recess 30 is overetched to an initial cross-sectional area that is larger than a final cross-sectional area that exists just prior to forming an embedded electrical interconnect 38 in the recess 30. Overetching the recess 30 may enhance deposition of materials in the recess 30, whereas smaller cross-sectional areas of the recess 30 may inhibit smooth flow or deposition of materials into the recess 30. Later deposition of materials, such as during formation of a protecting liner 40, can shrink the cross-sectional area to desired dimensions that are suitable for receiving the embedded electrical interconnect 38 and sufficiently insulating the gate electrode 18 from the embedded electrical interconnect 38. In an embodiment, the recess 30 is overetched to an initial cross-sectional area that is from about 30 to about 150% larger, such as from about 50 to about 100% larger, than a subsequent cross-sectional area after forming the protecting liner 40 as described in further detail below.

Figure 4:
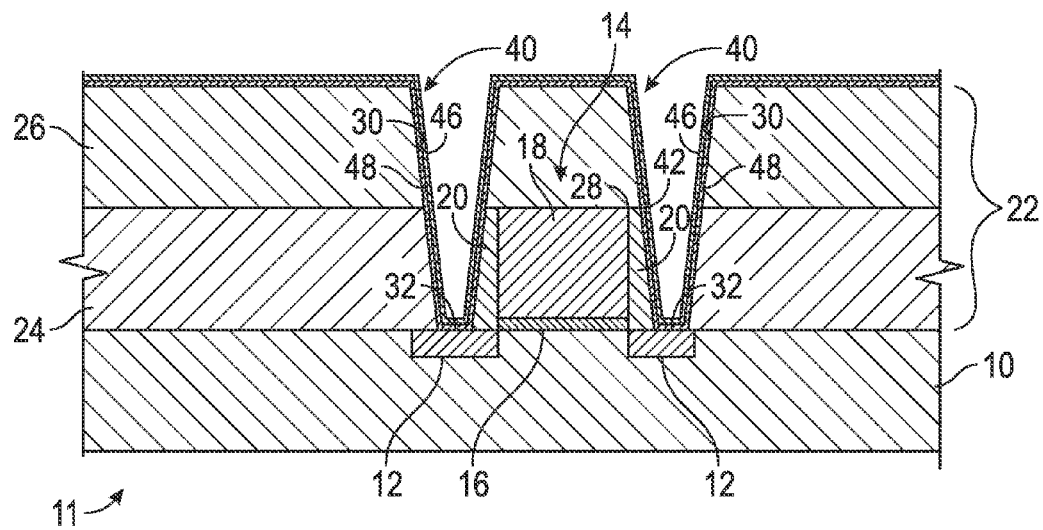
FIG. 4 is a schematic cross-sectional side view of the portion of the integrated circuit of FIG. 3 with a protecting liner formed in the recess and over the exposed surface of the embedded electrical contact in the recess, the protecting liner including an underlying liner layer and an outermost liner layer.

Etching the recess 30 exposes an opening 42 into the interface 28 between the gate electrode 18 and the at least one dielectric layer 24, 26 of the interlayer dielectric 22 in the recess 30. Referring to FIG. 4, a protecting liner 40 is formed in the recess 30 and over the exposed surface 32 of the embedded electrical contact 12 in the recess 30, and the protecting liner 40 seals the opening 42 into the interface 28 in the recess 30. The protecting liner 40 is different from the embedded electrical interconnect 38, and any barrier layers 44 that include electrically-conductive barrier material and that effectively seal the embedded electrical interconnect 38 from the interlayer dielectric 22, in that the protecting liner 40 is formed prior to further processing that involves surface treatment of the embedded electrical contact 12 whereas the embedded electrical interconnect 38 and associated barrier layers 44 are formed after all processing of the recess 30 and features exposed by the recess 30 is complete. In this regard, the protecting liner 40 may be formed immediately after recess 30 formation and prior to any further processing. In particular, once the recess 30 is formed and optionally cleaned, the protecting liner 40 is formed directly on sides of the recess 30 and on the exposed surface 32 of the embedded electrical contact 12. In an embodiment, the protecting liner 40 is formed by successively forming at least two liner layers 46, 48 in the recess 30 and over the exposed surface 32 of the embedded electrical contact 12 in the recess 30. In this embodiment, the at least two liner layers 46, 48 of the protecting liner 40 include an outermost liner layer 46 and an underlying liner layer 48, and the underlying liner layer 48 may be in direct contact with the interlayer dielectric 22 at the sides of the recess 30.

The at least two liner layers 46, 48 have materially different etch rates in different etchants, as described above, which enables preferential etching of the protecting liner 40 at a bottom of the recess 30 to enable the embedded electrical contact 12 to again be exposed, while also ensuring that the underlying liner layer 48 is etchable with an etchant that has an immaterial etching effect on the embedded electrical contact 12. In an embodiment, all liner layers 46, 48 include dielectric material, which may be particularly useful when overetching is employed because the dielectric materials can be used to replace overetched portions of the interlayer dielectric 22. In an embodiment, the underlying liner layer 48 is formed from a first dielectric material and the outermost liner layer 46 is formed from a second dielectric material different from the first dielectric material. For example, in an embodiment, the underlying liner layer 48 is formed from the first dielectric material that includes a nitride, and the outermost liner layer 46 is formed from the second dielectric material that includes an oxide. Suitable nitrides and oxides are described above relative to interlayer dielectric materials. In another embodiment, the outermost liner layer 46 is formed from a second material that is a metal-containing material, such as but not limited to tantalum, tantalum nitride, or titanium nitride. Also, under conditions of overetching, thickness of the underlying liner layer 48 may be varied to achieve the desired cross-sectional area of the recess 30, and the outermost liner layer 46 may be formed at an appropriate thickness to protect the underlying liner layer 48 from subsequent etching in areas where the underlying liner layer 48 is intended to remain (such as on sides of the recess 30). For example, in an embodiment, the underlying liner layer 48 has a thickness of from about 2 to about 15 nm, such as from about 5 to about 10 nm, and the outermost liner layer 46 has a thickness of from about 2 to about 15 nm, such as from about 5 to about 10 nm.

Figure 5:
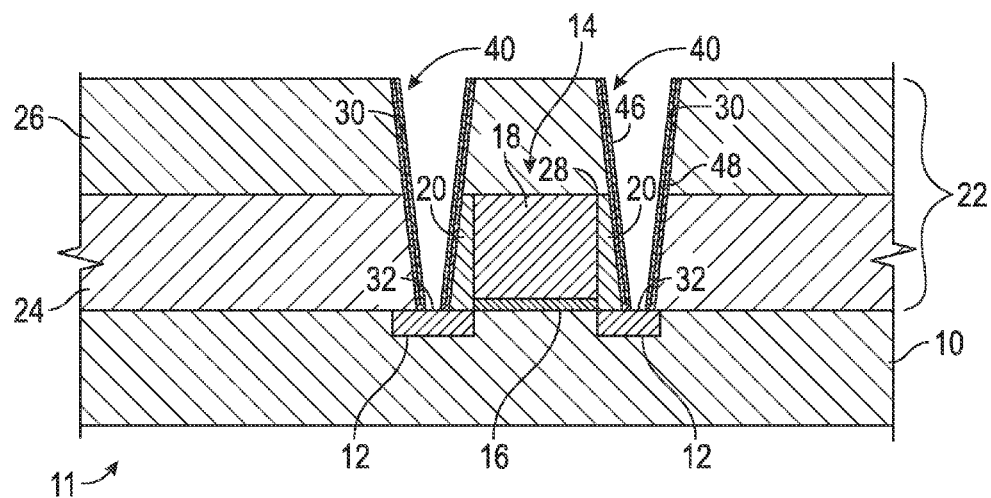
FIG. 5 is a schematic cross-sectional side view of the portion of the integrated circuit of FIG. 4 showing removal of a portion of the protecting liner over the surface of the embedded electrical contact to again expose the surface of the embedded electrical contact in the recess.

After forming the protecting liner 40, and as shown in FIG. 5, a portion of the protecting liner 40 over the surface 32 of the embedded electrical contact 12 is removed to again expose the surface 32 of the embedded electrical contact 12 in the recess 30, thereby allowing access to the embedded electrical contact 12 for further processing as described in further detail below. In an embodiment, the outermost liner layer 46 is first etched with a first etchant, such as an oxide etchant. Examples of suitable oxide etchants include, but are not limited to, $CHF_3$, $CF_4$, or $SF_6$. Etching may be conducted anisotropically, where horizontal surfaces are etched at faster rates than vertical surfaces such that a portion of the outermost liner layer 46 remains over the sides of the recess 30 while the portions of the outermost liner layer 46 are completely removed from horizontal surfaces, such as over the surface of the interlayer dielectric 22 and over the surface 32 of the embedded electrical contact 12 in the recess 30, with the underlying liner layer 48 functioning as an etch-stop. The underlying liner layer 48 is then etched with a second etchant different from the first etchant to again expose the surface 32 of the embedded electrical contact 12 in the recess 30. In an embodiment, where the innermost liner layer includes a nitride, the second etchant may be a nitride etchant. Examples of suitable nitride etchants include, but are not limited to, $CHF_3/O_2$ mixtures, and etching can be conducted through dry etching techniques. The portions of the outermost liner layer 46 that remain over the sides of the recess 30 function as a mask to shield the portions of the underlying liner layer 48 thereunder from etching, while exposed portions of the underlying liner layer 48 over the surface of the interlayer dielectric 22 and over the surface 32 of the embedded electrical contact 12 in the recess 30 are removed. Anisotropic or isotropic etching is possible due to the function of the outermost liner layer 46 masking the underlying liner layer 48.

Figure 6:
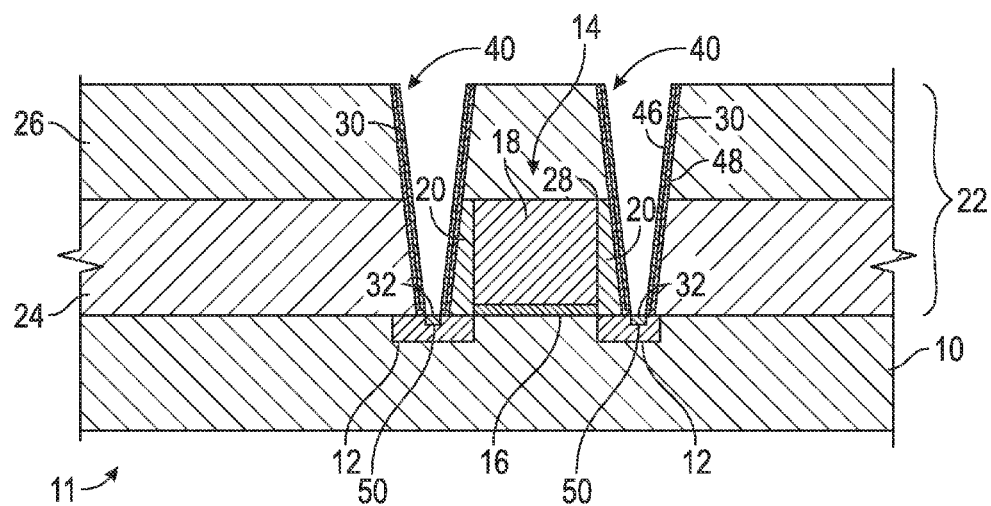
FIG. 6 is a schematic cross-sectional side view of the portion of the integrated circuit of FIG. 5 showing a salicide layer formed in the embedded electrical contact.

After the surface 32 of the embedded electrical contact 12 in the recess 30 is again exposed, additional processing can be conducted that could otherwise degrade the interlayer dielectric 22 or result in flow of metal ions from the metal interconnect or other harsh compounds through the interfaces 28 to other sensitive features within the integrated circuit 13 if the protecting liner 40 were absent from the sides of the recess 30. For example, in an embodiment and as shown in FIG. 6, a salicide layer 50 is formed in the embedded electrical contact 12 after removing the portion of the protecting liner 40 over the surface 32 of the embedded electrical contact 12. Presence of the salicide layer 50 functions to lower sheet resistance of the embedded electrical contact 12 under circumstances where the embedded electrical contact 12 includes silicon-containing material, such as doped silicon, and further aids in establishing low contact resistance to the embedded electrical contact 12. As referred to herein, "salicide layer" refers to a self-aligned silicide layer 50, with the self-aligned nature of silicide formation resulting from the formation of the salicide layer 50 in the region of the embedded electrical contact 12 that is exposed in the recess 30 without the need for separate patterning techniques. As also referred to herein, "silicide" is a compound including silicon and a metal that is more electropositive than silicon such as, but not limited to, cobalt, nickel, titanium, tantalum, platinum, palladium, rhodium, and mixtures of these metals. To form the salicide layer 50, a metal layer (not shown) including a silicide-forming metal is formed on the exposed surface 32 of the embedded electrical contact 12. In particular, the silicide-forming metal is blanket deposited over the interlayer dielectric 22 and in the recess 30.

After forming the metal layer, the semiconductor substrate 11 is thermally annealed at temperatures and times that are sufficient to react the silicide-forming metal in the metal layer and the silicon-containing material in the embedded electrical contact 12, thereby forming the salicide layer 50. The salicide layer 50 will only form where the metal layer is in contact with silicon, and the metal layer remains unreacted everywhere else. Unreacted metal can be wet etched from the metal layer with a wet etching solution that includes a metal etchant, using for example a $H_2O_2/H_2SO_4$ or $HNO_3/HCl$ solution, to thereby expose the salicide layer 50 in the recess 30 as shown in FIG. 6. Processing associated with formation of the salicide layer 50, such as the wet etching technique and metal layer formation, may result in the aforementioned detrimental effects to the interlayer dielectric 22 and/or flow of harsh compounds through the interfaces 28 were the protecting liner 40 to be absent. However, the presence of the protecting liner 40 enables the salicide layer 50 to be formed without the aforementioned detriments.

While not specifically described herein, it is to be appreciated that additional processing can be conducted prior to forming an embedded electrical interconnect 38 in the recess 30, either in addition to or as an alternative to forming the salicide layer 50. For example, additional cleaning steps, etching steps, and/or formation of additional features can be conducted prior to forming the embedded electrical interconnect 38, and also prior to forming the barrier layer 44 including electrically-conductive barrier material.

Figure 7:
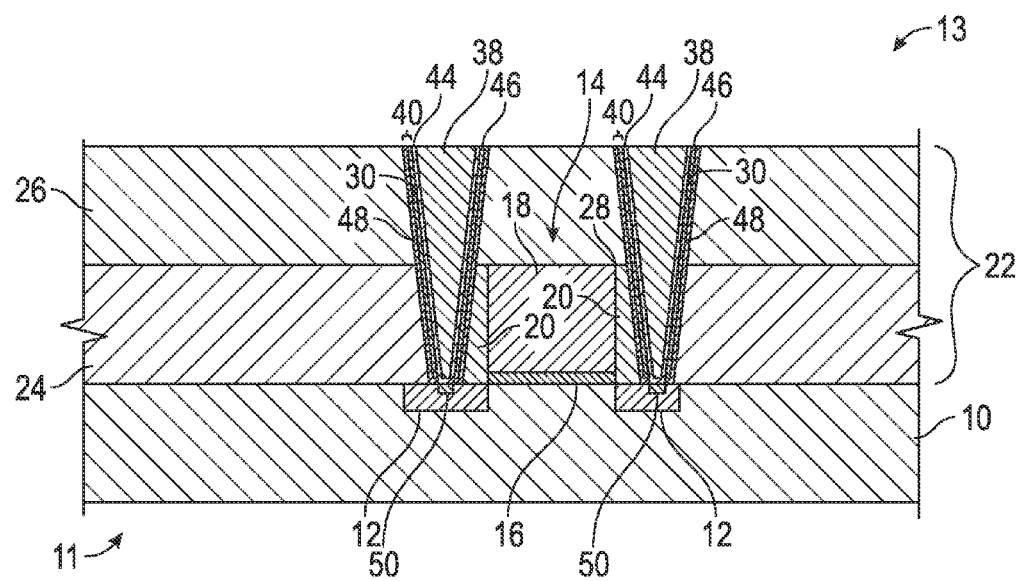
FIG. 7 is a schematic cross-sectional side view of the portion of the integrated circuit of FIG. 6 showing formation of an embedded electrical interconnect overlying the protecting liner on sides of the recess and the salicide layer on a bottom of the recess.

In an embodiment and as shown in FIG. 7, the electrically-conductive barrier material is deposited in the recess 30 to form the barrier layer 44, over the protecting liner 40 on the sides of the recess 30 and over the salicide layer 50 on the bottom of the recess 30, prior to forming the embedded electrical interconnect 38 in the recess 30. A barrier liner (not shown) may be formed in the recess 30 prior to forming the barrier layer 44 to provide a further barrier to diffusion of the metal ions and to enhance adhesion between the barrier layer 44 and the sides of the recess 30. The barrier layer 44 functions as a barrier to diffusion of metal ions from the electrically-conductive material of the embedded electrical interconnect 38 into the interface 28, whereas the protecting liner 40 protects the interlayer dielectric 22 and prevents compounds from diffusing into the interface 28 after forming the recess 30 but before the barrier layer 44 is formed. The embedded electrical interconnect 38 is formed in the recess 30 after forming the barrier layer 44, with the embedded electrical interconnect 38 then overlying the protecting liner 40 on sides of the recess 30 and the salicide layer 50 on the bottom of the recess 30.

Techniques for forming barrier layers 44, barrier liners, and embedded electrical interconnects 38 are known in the art. In an embodiment, the electrically-conductive barrier material is a refractory metal nitride, such as a nitride of niobium, molybdenum, tantalum, tungsten, or rhenium. Refractory metal nitrides provide excellent diffusion barrier properties and that also exhibits chemical stability and high electrical conductivity. One specific example of a suitable refractory metal nitride that is suitable for the barrier material is tantalum nitride. The barrier liner may be formed from barrier liner material that is different from the barrier material and, in an embodiment, is chosen from, but is not limited to, elemental tantalum, cobalt, rhenium, niobium, vanadium, ruthenium, or a combination thereof. The embedded electrical interconnect 38 is formed from electrically-conductive material that is different from the barrier material and barrier liner material and has sufficient electrical conductivity to facilitate electrical connection in a circuit, e.g., with electrical resistivity of less than or equal to about 30 $\mu\Omega\cdot$cm. Examples of suitable electrically-conductive materials include metals such as, but not limited to, copper, titanium, or tungsten. In an embodiment, the electrically-conductive material is substantially pure copper (e.g., at least about 99% pure) and may be electronics grade copper that is suitable for sensitive circuitry of integrated circuits. It is to be appreciated that the barrier material, the barrier liner material, and the electrically-conductive material are generally uniformly deposited over the interlayer dielectric 22, in addition to depositing in the recess 30, followed by removing the barrier material, the barrier liner material, and the electrically-conductive material that are outside of the recess 30 through techniques such as CMP. The resulting integrated circuit 13 is formed after the embedded electrical interconnect 38 is formed in the recess 30, as shown in FIG. 7.

Figure 8:
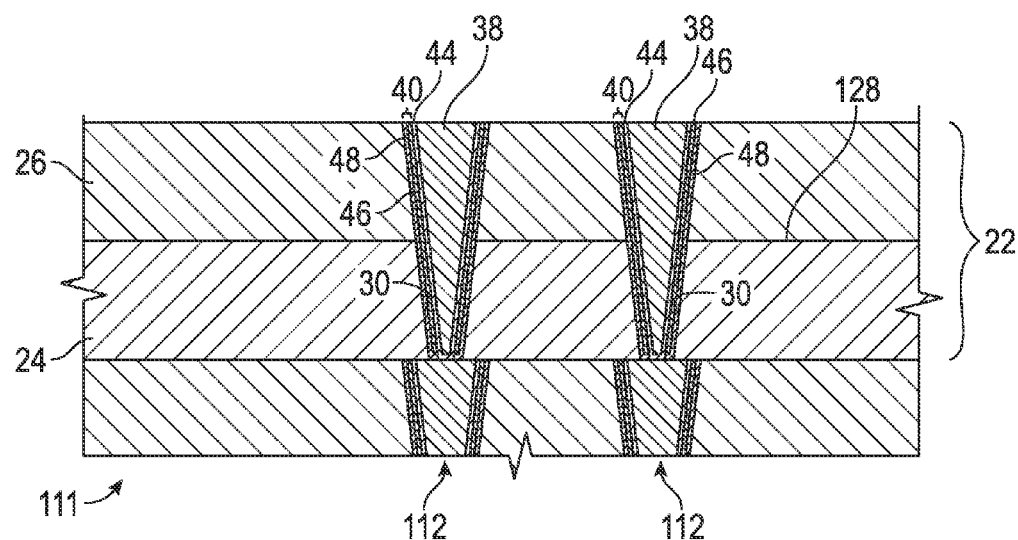
FIG. 8 is a schematic cross-sectional side view of a portion of an integrated circuit in accordance with another embodiment showing an embedded electrical interconnect overlying a protecting liner on sides of a recess, and further overlying a bottom of the recess.

In another embodiment, as shown in FIG. 8, the base substrate 111 is an underlying dielectric layer 111, such as the interlayer dielectric shown in FIG. 7, and the method described above is conducted with the aim of establishing electrical connection to the embedded electrical contacts 112, such as underlying electrical interconnects 112 that are disposed in the underlying dielectric layer 111. Other than the difference in the type of embedded electrical contact 112, the method remains the same as described above in the context of FIGS. 1-7. However, salicide layer formation is not conducted in this embodiment because the embedded electrical contacts 112 include metal, and not silicon-containing material. As such, the usefulness of the salicide layer in this embodiment is moot. However, it is to be appreciated that other processing may be desired prior to forming an embedded electrical interconnect 38 in the recess 30 of this embodiment, as an alternative to forming the salicide layer, and such additional processing may benefit from the presence of the protecting liner 40. For example, additional cleaning steps, etching steps, and/or formation of additional features can be conducted prior to forming the embedded electrical interconnect 38, and also prior to forming the barrier layer 44 including electrically-conductive barrier material in this embodiment, and protecting an interface 128 between the first dielectric layer 24 and the second dielectric layer 26 may still be desirable under such circumstances.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method of forming an integrated circuit, the method comprising:

provoking a base substrate having an embedded electrical contact disposed therein;

forming an interlayer dielectric overlying the base substrate;

etching a recess through the interlayer dielectric over the embedded electrical contact with a surface of the embedded electrical contact exposed in the recess;

forming a protecting liner in the recess and over the exposed surface of the embedded electrical contact in the recess, the protecting liner comprising at least two liner layers having materially different etch rates in different etchants;

removing a portion of the protecting liner over the surface of the embedded electrical contact to again expose the surface of the embedded electrical contact in the recess;

forming an embedded electrical interconnect in the recess, the embedded electrical interconnect overlying the protecting liner on sides of the recess.

2. The method of claim 1, wherein forming the protecting liner comprises successively forming the at least two liner layers in the recess and over the exposed surface of the embedded electrical contact in the recess.

3. The method of claim 2, wherein the at least two liner layers of the protecting liner comprise an outermost liner layer and an underlying liner layer, and wherein removing the portion of the protecting liner comprises first etching the outermost liner layer with a first etchant, followed by etching the underlying liner layer with a second etch different from the first etchant to again expose the surface of the embedded electrical contact in the recess.

4. The method of claim 3, wherein forming the protecting liner comprises forming the underlying liner layer comprising a first dielectric material and forming the outermost liner layer comprising a second material chosen from a second dielectric material different from the first dielectric material or a metal-containing material.

5. The method of claim 4, wherein forming the protecting liner comprises forming the underlying liner layer from the first dielectric material including a nitride, and forming the outermost liner layer from the second material comprising an oxide.

6. The method of claim 4, wherein forming the protecting liner comprises forming the underlying liner layer having a thickness of from about 2 to about 15 nm, and forming the outermost liner layer having a thickness of from about 2 to about 15 nm.

7. The method of claim 1, wherein providing the base substrate comprises providing a semiconductor substrate having the embedded electrical contact disposed therein and comprising silicon-containing material.

8. The method of claim 7, further comprising forming a salicide layer in the embedded electrical contact after removing the portion of the protecting liner over the surface of the embedded electrical contact, wherein the embedded electrical interconnect overlies the protecting liner on sides of the recess and the salicide layer on a bottom of the recess.

9. The method of claim 8, wherein forming the salicide layer comprises depositing a metal layer on the exposed surface of the embedded electrical contact and thermally annealing the semiconductor substrate to react the metal layer and the silicon-containing material, thereby forming the salicide layer.

10. The method of claim 9, further comprising wet etching unreacted metal from the metal layer with a wet etching solution comprising a metal etchant to expose the salicide layer in the recess.

11. The method of claim 7, wherein providing the semiconductor substrate comprises forming a transistor on the semiconductor substrate, wherein the transistor comprises a gate electrode.

12. The method of claim 11, wherein forming the interlayer dielectric further comprises forming at least one dielectric layer overlying the gate electrode, wherein an interface is defined between the gate electrode and the at least one dielectric layer, wherein etching the recess exposes an opening into the interface in the recess, and wherein forming the protecting liner seals the opening into the interface in the recess.

13. The method of claim 1, wherein providing the base substrate comprises providing an underlying dielectric layer, and wherein the embedded electrical contact comprises an underlying electrical interconnect.

14. The method of claim 1, wherein etching the recess through the interlayer dielectric comprises overetching the recess to an initial cross-sectional area from about 30 to about 150% larger in than a subsequent cross-sectional area after forming the protecting liner.

15. The method of claim 1, further comprising depositing an electrically-conductive barrier material in the recess to form a barrier layer over the protecting liner prior to forming the embedded electrical interconnect in the recess.

16. A method of forming an integrated circuit, the method comprising:
    providing a semiconductor wafer;
    forming a transistor on the semiconductor wafer to form a semiconductor substrate, wherein the transistor comprises a gate electrode and embedded electrical contacts disposed in the semiconductor wafer on opposite sides of the gate electrode, the embedded electrical contacts comprising silicon-containing material;
    forming an interlayer dielectric overlying the semiconductor substrate;
    etching a recess through the interlayer dielectric over the embedded electrical contacts with surfaces of the embedded electrical contacts exposed in the recess;
    forming a protecting liner in the recess and over the exposed surfaces of the embedded electrical contacts in the recess, the protecting liner comprising an underlying liner layer comprising a first dielectric material and an outermost liner layer comprising a second material chosen from a second dielectric material different from the first dielectric material or a metal-containing material;
    removing a portion of the protecting liner over the surface of the embedded electrical contacts to again expose the surface of the embedded electrical contacts in the recess;
    forming a salicide layer in the embedded electrical contacts after removing the portion of the protecting liner over the surfaces of the embedded electrical contacts;
    depositing an electrically-conductive barrier material in the recess to form a barrier layer over the protecting liner;
    forming an embedded electrical interconnect over the barrier layer in the recess, the embedded electrical interconnect overlying the protecting liner on sides of the recess and the salicide layer on a bottom of the recess.

* * * * *